United States Patent
King et al.

(10) Patent No.: US 6,232,821 B1
(45) Date of Patent: May 15, 2001

(54) SYSTEM FOR ALLOWING BELOW-GROUND AND RAIL-TO-RAIL INPUT VOLTAGES

(75) Inventors: Eric T. King, Temple; Bruce P. Del Signore, Hollis, both of NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/483,801

(22) Filed: Jan. 15, 2000

(51) Int. Cl.⁷ .................................................. H03K 17/16
(52) U.S. Cl. ......................... 327/390; 327/389; 327/379; 327/382
(58) Field of Search ..................... 327/379, 382, 327/387, 389, 390, 391, 427, 434, 589

(56) References Cited

U.S. PATENT DOCUMENTS

| | | | |
|---|---|---|---|
| 4,574,203 | * | 3/1986 | Baba ..................................... 327/390 |
| 5,903,399 | * | 5/1999 | Bosnyak ............................... 327/384 |
| 6,072,353 | * | 6/2000 | Matsuzawa ........................... 327/390 |
| 6,072,354 | * | 6/2000 | Tachibana et al. ................... 327/390 |

* cited by examiner

Primary Examiner—Terry D. Cunningham
(74) Attorney, Agent, or Firm—David L. Stewart; Peter T. Rutkowski

(57) ABSTRACT

A capacitively isolated input system that permits sensing of an input voltage with a below-ground value or a below-substrate voltage value. Multiple input signals are received, and each input signal is connected to cross-connected switching components. Switched output signals are capacitively connected to additional switching components and to a sensing amplifier. This system allows the sensing amplifier to receive capacitively isolated input signals and to provide corresponding output signals at voltages no lower than ground voltage.

1 Claim, 4 Drawing Sheets

PHlb

PHld

UPb

PHILOW

SYSTEM FOR ALLOWING BELOW-GROUND AND RAIL-TO-RAIL INPUT VOLTAGES

BACKGROUND OF THE INVENTION

1. Field of the Invention

This invention relates to control of input signals for analog-to-digital converters.

2. Description of the Related Art

Many analog-to-digital converters (ADCs) require that each analog input potential (voltage) not exceed the supply voltage. Many applications, including energy meters require use of additional devices and/or level-shifting circuits to allow the ADC to conform to this requirement. In the past, several approaches have been proposed to handle these problems.

A first approach provides an on-chip mid-supply voltage and creates a virtual ground relative to this supply at the analog input terminals. This approach allows use of a resistor for connection to the analog signal source. The corresponding input signal current is transformed into a voltage signal and is processed on the chip. Some difficulties encountered with this approach are (1) the current to voltage transformation must be at least as linear as is required for ADC operations, (2) each ADC must reject any noise associated with the mid-supply voltage source, and (3) these circuits require additional chip real estate and require additional heat dissipation for the additional current.

A second approach generates an on-chip voltage supply using a charge pump to turn switches on and off. Some variations of this approach are disclosed in U.S. Pat. No. 5,872,469, issued to Nestler. One difficulty encountered here is that a rail-to-rail input signal common mode is not available. Further, the required pump voltage is rather large and may damage an IC fabricated using a deep-submicron technology.

What is needed is an approach that provides a rail-to-rail input signal common mode and allows use of voltages below the ground voltage (zero) established by a standard voltage supply. Preferably, this approach should be flexible enough to allow provision of any reasonable below-zero voltage and should not require excessive additional chip real estate or heat dissipation.

SUMMARY OF THE INVENTION

These needs are met by the invention, which provides for a rail-to-rail input signal common mode and for use of below-zero voltages by limiting the input signal range to allow for use of a conventional switched capacitor input signal network for turning switches on and off. A small pump voltage (below zero by less than 1 volt) is generated to turn any switch completely off. This precludes the presence of any small, but non-zero, current in any analog source impedance. Such a non-zero current, if present, would compromise the ADC linearity.

DESCRIPTION OF THE BEST MODES OF THE INVENTION

Figure 1:
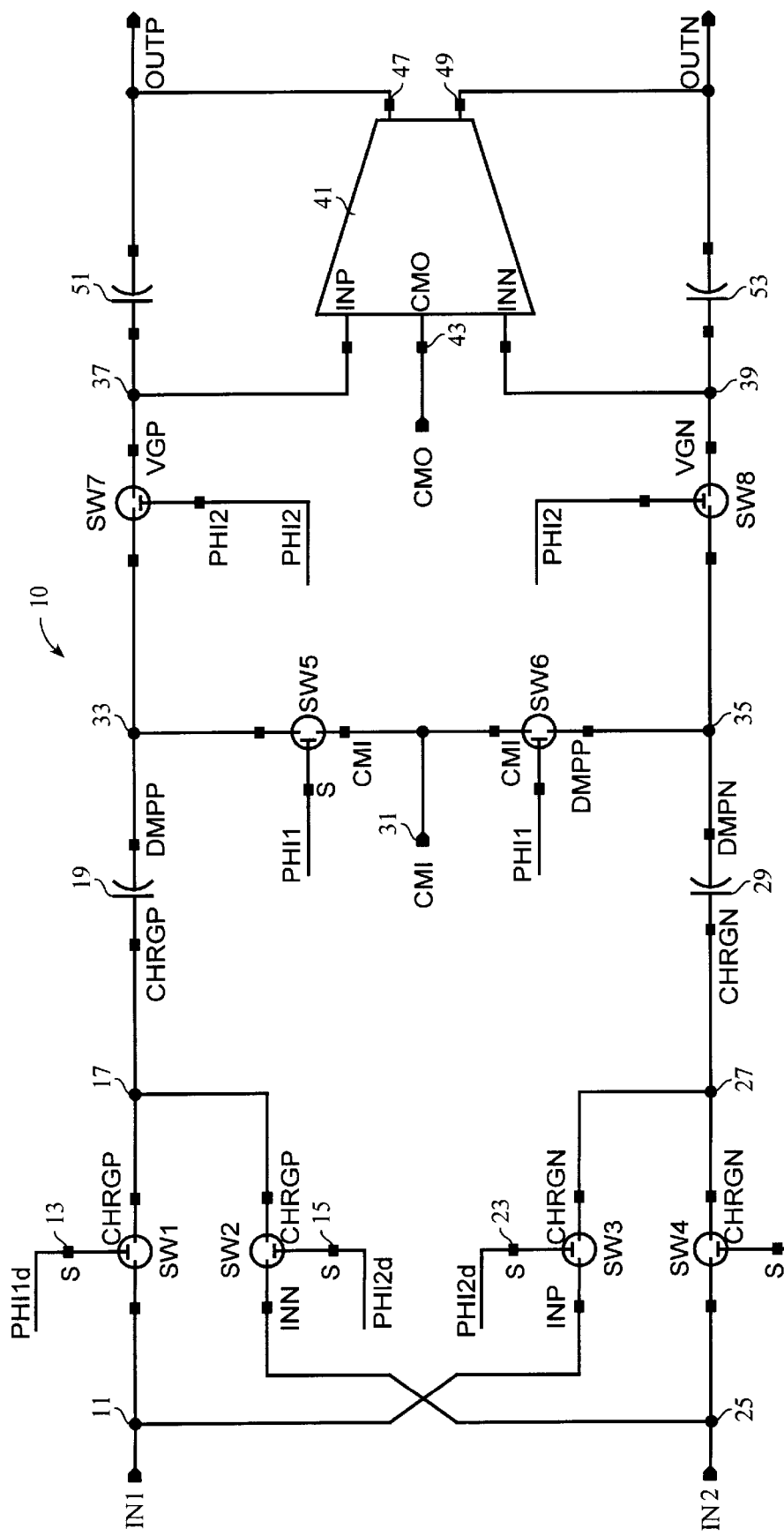
FIG. 1 is a schematic view of a conventional switched capacitor network.

FIG. 1 illustrates a typical switched capacitor input network 10, having eight independently operated switches, SW1, SW2, SW3, SW4, SW5, SW6, SW7 and SW8. Electric charges passing the switches SW1 and SW4 are sampled by a first charge reservoir with associated voltage phi1d; and electric charge passing the switches SW2 and SW3 are sampled by a second charge reservoir with associated voltage phi2d. In a preferred mode of operation, at most one pair of switches, (SW1/SW4 and SW2/SW3, would be closed at any time. The first and fourth switches, SW1 and SW4, have a first control voltage, phi1d, and the second and third switches, SW2 and SW3, have a second control voltage, phid2.

A first input signal IN1, and/or a second input signal IN2, is received at a first signal input terminal 11, or at a second input terminal 25, respectively. The first input signal IN1 is also received, through cross-connection, at the switches SW1 and SW3 and, if these switches are closed, is received at first and second dc-isolating capacitors, 19 and 29, that are preferably matched. In a similar manner, the second input signal IN2 is received, through cross-connection, at the switches SW2 and SW4 and, if these switches are closed, is received at the first and second dc-isolating capacitors, 19 and 29. Fifth and sixth switches, SW5 and SW6, with a corresponding third control voltage phi1, are located downstream from the first and second capacitors, 19 and 29. Seventh and eighth switches, SW7 and SW8, with a corresponding fourth control voltage phi2, are also located downstream from the first and second capacitors, 19 and 29. Preferably, each of the switch pairs SW1/SW4, SW2/SW3, SW5/SW6 and SW7/SW8 closes together and opens together. The switch pairs SW1/SW4 and SW2/SW3 are not closed at the same time; and the switch pairs SW5/SW6 and SW7/SW8 are not closed at the same time.

A voltage signal appearing at an input terminal, 11 and/or 25, is converted to a charge on one plate of the first and/or second capacitor, 19 and 29. If the seventh switch SW7 (or the eighth switch SW8) is closed, charge on the first capacitor 19 (or on the second capacitor 29) is forced onto a third capacitor 51 (or onto a fourth capacitor 53), providing a summation or integration of charge.

In a typical switched capacity input signal network, as illustrated in FIG. 1, electric charge associated with an input signal is sampled and transferred to two charge reservoirs with associated voltages phi1 and phi2, respectively. Because the switches SW5, SW6, 7 and SW8 are dc-isolated from the input signals by the first and second capacitors, 19 and 29, the switch control voltages phi1 and phi2 are not critical. However, the switch control voltages phi1d and phi2d must switch to voltage values below the zero voltage supply, if the voltages for the input signals, IN1 and IN2, are to be allowed to drop below the zero supply voltage values.

If the switches SW1 and SW4 (or SW2 and SW3) are NMOS devices, the corresponding gate voltages must exceed the voltage $V_{in,p}$ (or $V_{in,n}$) by an amount at least equal to $V_{thr}$(=1 volt here) in order to turn on and must be lower than $V_{in,p}$(or $V_{in,n}$) in order to turn off. If the switches SW1 (or SW4), SW2 (or SW3) are PMOS devices, the corresponding gate voltages must be lower than the voltage $V_{in,p}-V_{thr}$(or $V_{in,n}-V_{thr}$) in order to turn on and must be higher than $V_{in,p}$ (or $V_{in,n}$) in order to turn off (Table 1).

TABLE 1

Required Switching Voltages

| Switch Action | Requirements Imposed (NMOS) | Requirements Imposed (PMOS) |
|---|---|---|
| On | $V_{in,p}$ (or $V_{in,n}$) < $V_{supply}$ − $V_{thr}$ NMOS gate voltage = $V_{supply}$ | $V_{in,p}$ (or $V_{in,n}$) > $V_{thr}$ PMOS gate voltage = 0 |
| Off | $V_{in,p}$ (or $V_{in,n}$) > 0 NMOS gate voltage = 0 | $V_{in,p}$ (or $V_{in,n}$) < $V_{supply}$ PMOS gate voltage = $V_{supply}$ |

For purposes of illustration, assume that a gate voltage generator (a typical ADC without the capability of converting voltages below the supply ground voltage) produces voltages between 0 and $V_{supply}$. Parallel combinations of NMOS and PMOS devices (i.e., transmission gates) can be used where 0<$V_{in,p}$ (or $V_{in,n}$)<$V_{supply}$.

Figure 2:
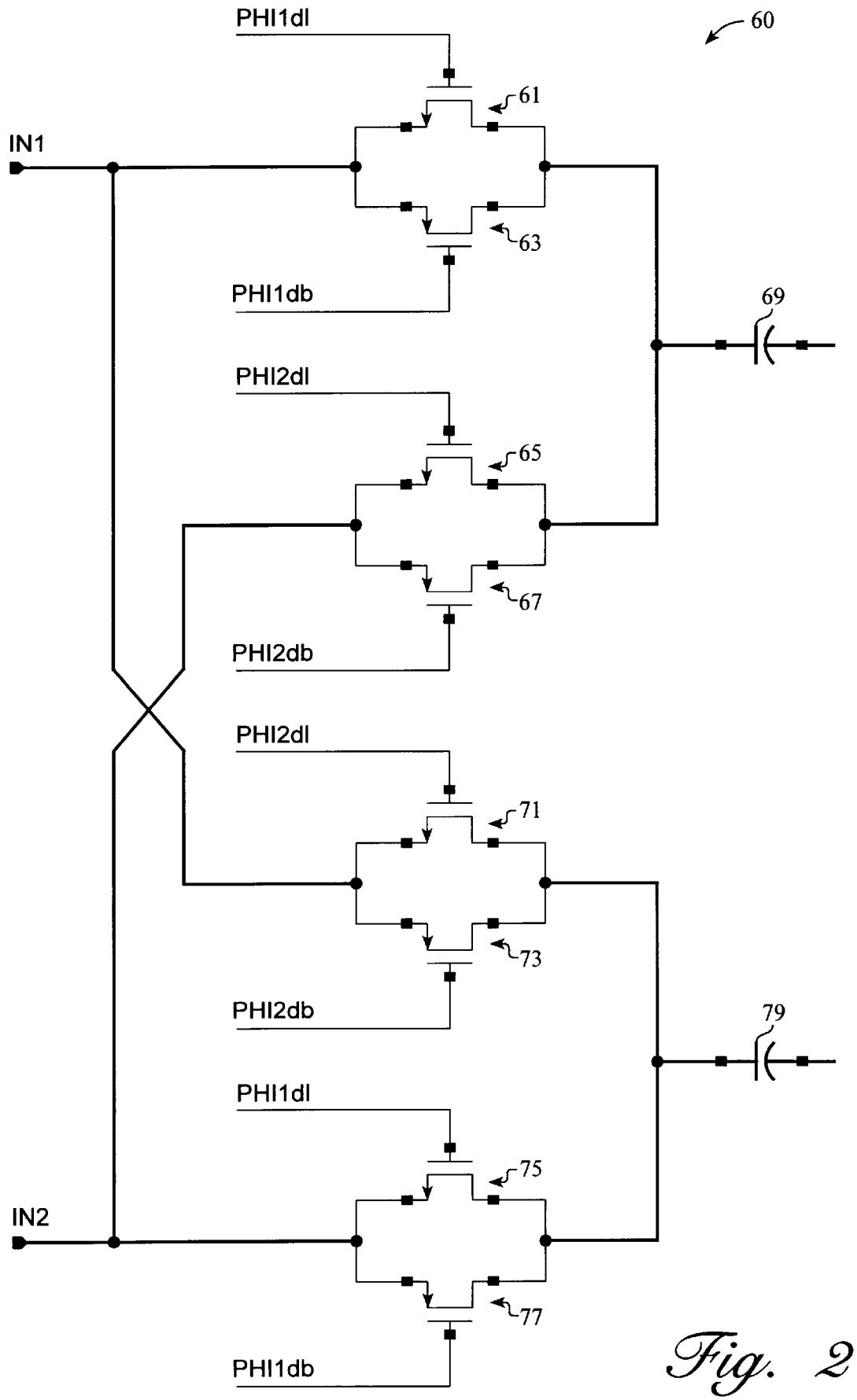
FIGS. 2 and 3 are schematic views of circuits used in an embodiment of the invention.

An input signal network 60, having a supply input between 0 volts and $V_{supply}$, with a transmission gate realization of the sampling switches, is illustrated in more detail in FIG. 2. A first input signal IN1 is received at the source of an NMOS transistor 61, at the source of a PMOS transistor 63, at the source of an NMOS transistor 71, and at the source of a PMOS transistor 73, having the respective gate voltages phi1dl, phi1db, phi2dl and phi2db. A second input signal IN2 is received at the source of an NMOS transistor 65, at the source of a PMOS transistor 67, at the source of an NMOS transistor 75, and at the source of a PMOS transistor 77, having the respective gate voltages of phi2di, phi2db, phi1di and phi1db. A signal passed by any of the transistors 61, 63, 65 and 67 is received at a first capacitor 69. A signal passed by any of the transistors 71, 73, 75 and 77 is received by a second capacitor 79. The two capacitors 69 and 79 provide isolation of any downstream components from a dc component in the signal IN1 and/or IN2.

The PMOS switches, 63, 67, 73 and 77, in FIG. 2 require a voltage of either 0 or $V_{supply}$. The NMOS switches, 61, 65, 71 and 75, require voltages that drop below zero voltage sufficiently to turn these devices completely off, if the input voltages are allowed to go below zero volts.

Figure 3:
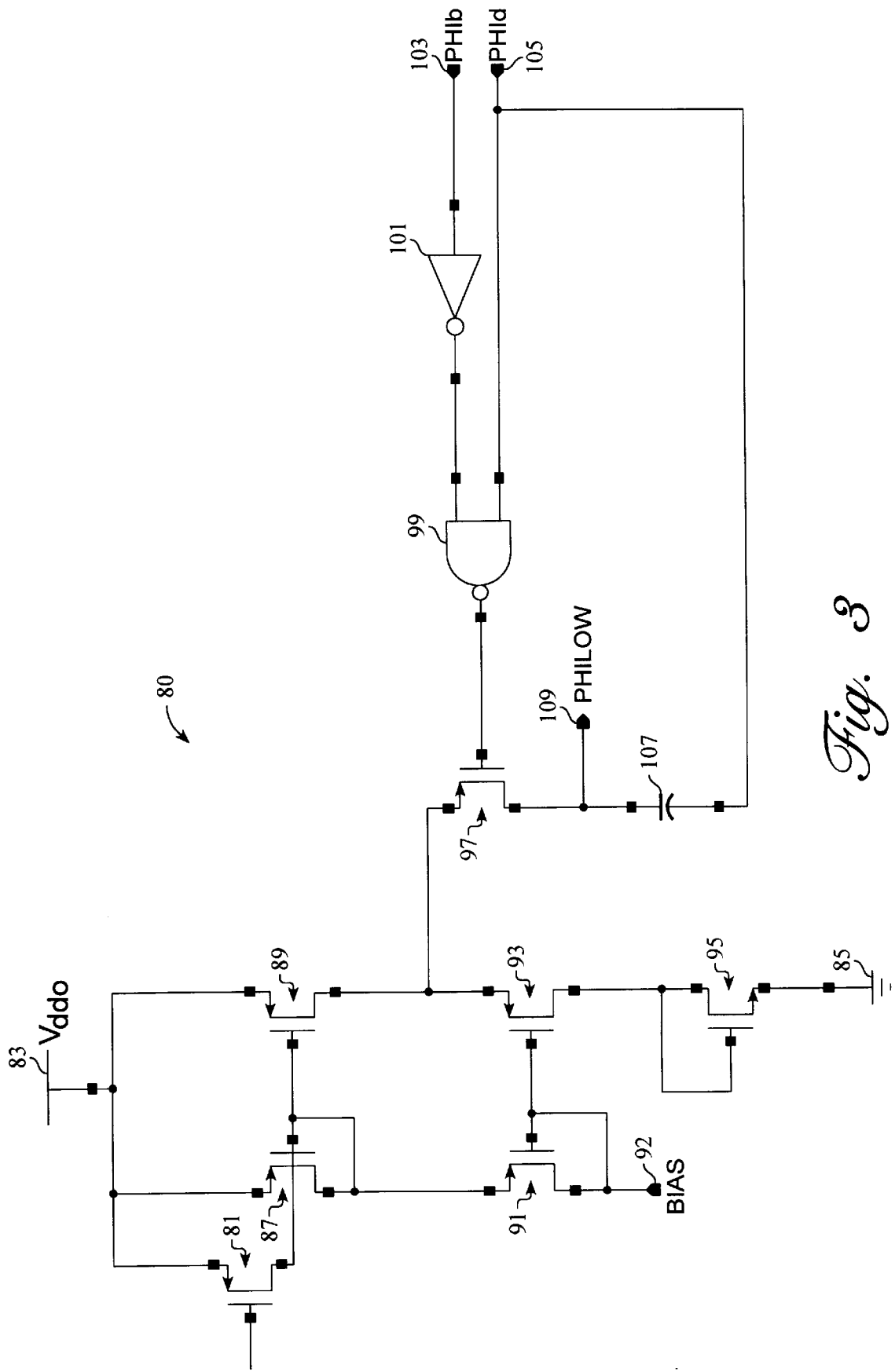
Figure 4A:
FIGS. 4A, 4B, 4C and 4D are graphical views of intermediate voltages produced by the circuit shown in FIG. 3.
Figure 4B:
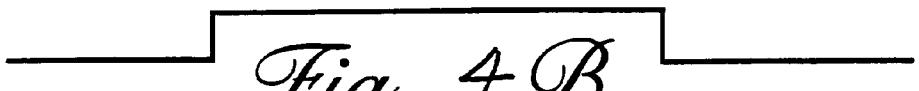
Figure 4C:
Figure 4D:

FIG. 3 illustrates one circuit 80 that will perform this device turn-off. A first gate voltage 81 has its source connected to a source 83 of a selected upper voltage Vdd0. A source 85 of a selected lower voltage provides a ground voltage. The source of a second (PMOS) transistor 87 is also connected to the voltage source 83. The gate and drain of the second transistor 87 are connected to each other (in a diode configuration) and are connected to a gate of a third (PMOS) transistor 89, which has a source also connected to the voltage source 83.

The gate and drain of the second transistor 87 are also connected to the source of a fourth (PMOS) transistor 91, whose gate and drain are both connected to a source 92 of a selected bias voltage. The gate and drain of the third transistor 91 are also connected to the gate of a fifth (PMOS) transistor 93, whose source is connected to the drain of the third transistor 89. The drain of the fifth transistor 93 is connected to the source and gate of a sixth (NMOS) transistor 95, whose drain is connected to the ground voltage source 85. The sixth transistor 95 is configured as a diode to minimize hot electron effects.

The of the third transistor 89 and source of the fifth transistor 93 are connected to the source of a seventh (PMOS) transistor 97, whose gate receives an output signal from a two-input terminal NAND gate 99. One input terminal of the NAND gate 99 receives a signal, inverted by an inverter gate 101, from a source 103 of a selected voltage phib. A second input terminal of the NAND gate 99 is connected to a source 105 of another selected voltage phid, and is also connected through a capacitor 107 to the drain of the seventh transistor 97. The drain of the seventh transistor 97 is also connected to a voltage output terminal 109 that produces the desired output voltage philow, which is optionally phi1d or phi2d.

The transistors 87, 89, 91 and 93 in FIG. 3 together provide a second constant voltage, $V = V_{supply} - V_d$. The Boolean logic gates 99 and 101 provide the necessary logic to control the pass transistor 97. When the voltage at the output terminal of the NAND gate 99 is 0, the source of the gate voltage philow is connected to a second constant voltage supply. When the voltage at the output terminal of the NAND gate 99 is equal to $V_{supply}$ and the voltage phid is 0, the pass transistor 97 is turned off and the capacitor 107 pulls the voltage philow down by an amount $\Delta V = V_{supply}$. This produces an NMOS gate voltage $$V = (V_{supply} - V_d) - V_{supply} = -V_d. \tag{1}$$

The associated charge pump circuit is insensitive to the supply voltage $V_{supply}$ used. The net negative supply voltage $-V_d$ is not dependent upon the value used for $V_{supply}$ so that a wide variety of supply voltages is available. One suitable choice of voltage input range is $-0.25$ volts<$V_{in}$<$V_{supply}$. By appropriately limiting the voltage input range, standard electrical input protection devices can be employed to protect the circuits during sustained overvoltages and ESD events. Use of such input protection devices would not be possible if the input voltage range is too great.

FIGS. 4A, 4B, 4C and 4D are graphical views of four voltage signals, phib, phid, upb and philow, as functions of time, produced in the device shown in FIG. 3. The voltages phi1dl and phi1db are inverses of each other, and the voltages phi2dl and phi2db are inverses of each other.

What is claimed is:

1. A system for turning off an electrical device having a threshold voltage for turn-off, the system comprising:

a voltage source having an adjustable voltage value;

a voltage pass gate connected to the voltage source and having an output terminal that, in one condition, provides an output signal voltage that is less than zero voltage;

a control logic mechanism, connected to the voltage pass gate and arranged to place the pass gate in an open condition and in at least one other condition, and positioned to receive at least one of a first input signal and a second input signal at a first input terminal and at a second input terminal, respectively; and a dc isolation mechanism, having a first terminal connected to the pass gate output terminal and having a second terminal connected to a selected one of the first and second input terminals.

* * * * *